(12) United States Patent
Huang (10) Patent No.: US 10,114,488 B2
(45) Date of Patent: Oct. 30, 2018

(54) INTERFACE MODULE AND MANUFACTURING METHOD THEREOF

(71) Applicants: INNOCOM TECHNOLOGY (SHENZHEN) CO., LTD., Longhua Town, Bao An District, Shenzhen (CN); InnoLux Corporation, Miao-Li County (TW)

(72) Inventor: Kung-Chieh Huang, Miao-Li County (TW)

(73) Assignees: INNOCOM TECHNOLOGY (SHENZHEN) CO., LTD., Longhua Town, Guangdong Province (CN); INNOLUX CORPORATION, Jhu Nan, Miao-Li County (TW)

( * ) Notice: Subject to any disclaimer, the term of this patent is extended or adjusted under 35 U.S.C. 154(b) by 288 days.

(21) Appl. No.: 14/969,556

(22) Filed: Dec. 15, 2015

(65) Prior Publication Data
US 2016/0103540 A1   Apr. 14, 2016

Related U.S. Application Data

(63) Continuation of application No. 13/685,056, filed on Nov. 26, 2012.

(30) Foreign Application Priority Data

Feb. 16, 2012   (TW) .............................. 101105043 A (51) Int. Cl.
*H05K 3/36*   (2006.01)
*G06F 3/041*   (2006.01)
(Continued)

(52) U.S. Cl.
CPC ............ *G06F 3/0412* (2013.01); *G06F 3/044* (2013.01); *H05K 1/147* (2013.01); *H05K 3/361* (2013.01);
(Continued)

(58) Field of Classification Search
None
See application file for complete search history.

(56) References Cited

U.S. PATENT DOCUMENTS 5,737,053 A * 4/1998 Yomogihara ....... G02F 1/13452
349/149
6,002,594 A   12/1999 Ledin et al.
(Continued)

FOREIGN PATENT DOCUMENTS

CN   1263280   8/2000
TW   200900784   1/2009

OTHER PUBLICATIONS

Chinese language office action dated Nov. 7, 2013, issued in application No. TW 101105043.
(Continued)

*Primary Examiner* — Courtney Smith
*Assistant Examiner* — Jessey R Ervin
(74) *Attorney, Agent, or Firm* — McClure, Qualey & Rodack, LLP (57) ABSTRACT

An interface module is provided. The interface module includes a substrate and a flexible print circuit board. The substrate includes a first side, a second side, a plurality of column electrodes and a plurality of row electrodes, wherein the first side is perpendicular to the second side, the column electrodes are formed on the substrate and arranged along the first side, and the row electrodes are formed on the substrate and arranged along the second side. The flexible print circuit board includes a first connection portion and a second connection portion, wherein the first connection portion is electrically connected to the column electrodes at the first side, and the second connection portion is electrically connected to at least a portion of the row electrodes at the second side.

12 Claims, 8 Drawing Sheets

(51) Int. Cl.
*H05K 1/14* (2006.01)
*G06F 3/044* (2006.01)

(52) U.S. Cl.
CPC .............. *G06F 2203/04103* (2013.01); *H05K 2201/052* (2013.01); *H05K 2201/053* (2013.01); *H05K 2201/056* (2013.01); *Y10T 29/49126* (2015.01)

(56) References Cited

U.S. PATENT DOCUMENTS

| | | | | |
|---|---|---|---|---|
| 6,519,021 | B1* | 2/2003 | Aruga | G02F 1/13452 |
| | | | | 349/151 |
| 6,903,717 | B2* | 6/2005 | Takahashi | G02F 1/1345 |
| | | | | 345/100 |
| 7,755,738 | B2 | 7/2010 | Chang et al. | |
| 7,932,987 | B2 | 4/2011 | Chang et al. | |
| 8,314,898 | B2 | 11/2012 | Chang et al. | |
| 8,576,209 | B2* | 11/2013 | Miyaguchi | G02F 1/133305 |
| | | | | 345/173 |
| 2008/0053713 | A1 | 3/2008 | Huang et al. | |
| 2008/0158181 | A1 | 7/2008 | Hamblin et al. | |
| 2008/0316416 | A1 | 12/2008 | Chang et al. | |
| 2009/0224245 | A1* | 9/2009 | Umezaki | G09G 3/3677 |
| | | | | 257/59 |
| 2012/0057312 | A1 | 3/2012 | Yoo | |

OTHER PUBLICATIONS

Chinese language office action dated Nov. 30, 2015, issued in application No. CN 201210034817.1.

\* cited by examiner

INTERFACE MODULE AND MANUFACTURING METHOD THEREOF

CROSS REFERENCE TO RELATED APPLICATIONS

This application is a Continuation of application Ser. No. 13/685,056, filed Nov. 26, 2012, which claims priority of Taiwan Patent Application No. 101105043, filed on Feb. 16, 2012, the entirety of which is incorporated by reference herein.

BACKGROUND OF THE INVENTION

Field of the Invention

The present invention relates to an interface module, and in particular relates to an interface module which is connected to a flexible print circuit board.

Description of the Related Art

Conventional interface modules, such as touch panel modules or display modules, have column electrodes and row electrodes formed on the substrate. The column electrodes and the row electrodes are electrically connected to an integrated circuit disposed on the substrate or disposed on a flexible print circuit board via a trace formed on an edge of the substrate. The integrated circuit on the substrate or the flexible print circuit board is then electrically connected to a main board via the flexible print circuit board.

Conventionally, the trace disposed on the edge of the substrate occupies surface area of the substrate, and the dimension of the interface module therefore cannot be reduced. Additionally, the line width of the trace has rigid restrictions, and the surface area of the substrate occupied by the trace therefore cannot be decreased.

BRIEF SUMMARY OF THE INVENTION

An interface module is provided. The interface module includes a substrate and a flexible print circuit board. The substrate includes a first side, a second side, a plurality of column electrodes and a plurality of row electrodes, wherein the first side is perpendicular to the second side, the column electrodes are formed on the substrate and arranged along the first side, and the row electrodes are formed on the substrate and arranged along the second side. The flexible print circuit board includes a first connection portion and a second connection portion, wherein the first connection portion is electrically connected to the column electrodes at the first side, and the second connection portion is electrically connected to at least a portion of the row electrodes at the second side.

In another embodiment of the invention, an interface module is provided. The interface module includes a first substrate, a second substrate and a flexible print circuit board. The first substrate includes a first side and a plurality of column electrodes, wherein the column electrodes are formed on the first substrate and arranged along the first side, and the column electrodes are extended to a first edge of the first side. The second substrate includes a second side and a plurality of row electrodes, wherein the row electrodes are formed on the second substrate and arranged along the second side, the row electrodes are extended to a second edge of the second side, and the first side is perpendicular to the second side. The flexible print circuit board includes a first connection portion and a second connection portion, wherein the first connection portion is electrically connected to the column electrodes at the first side, and the second connection portion is electrically connected to at least a portion of the row electrodes at the second side.

Utilizing the interface module of the embodiments of the invention, the flexible print circuit board is electrically connected to the row electrodes on the second and third sides of the substrate, and the flexible print circuit board is bent and attached to the back side of the interface module. The dimension of the interface module is therefore decreased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
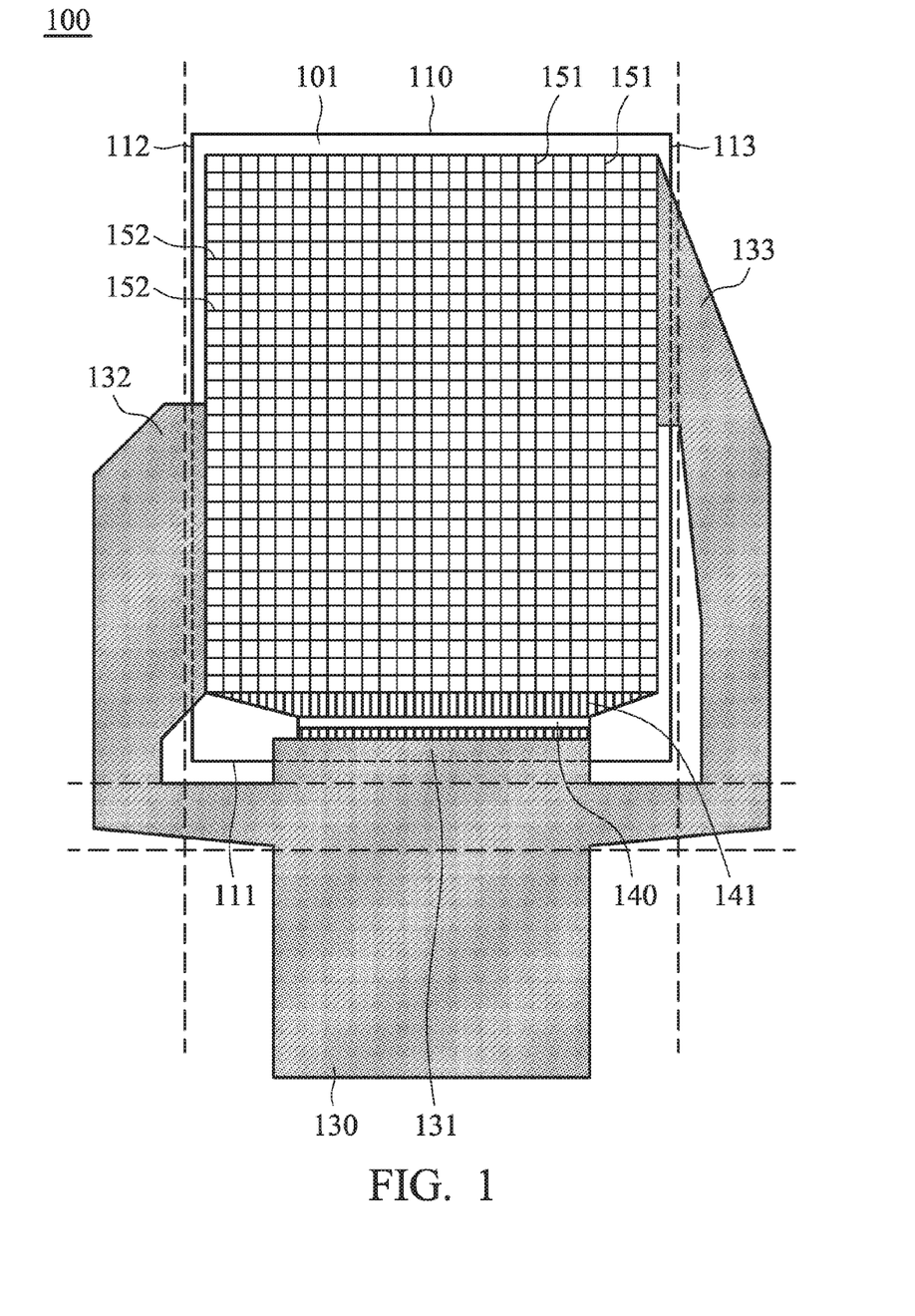
FIG. 1 shows the interface module of a first embodiment of the invention.

FIG. 1 shows an interface module 100 of a first embodiment of the invention, comprising a substrate 110 and a flexible print circuit board 130. The substrate 110 comprises a first side 111, a second side 112, a plurality of column electrodes 151 and a plurality of row electrodes 152. The column electrodes 151 are formed on the substrate 110 and arranged along the first side 111, and the row electrodes 152 are formed on the substrate 110 and arranged along the second side 112. The flexible print circuit board 130 comprises a first connection portion 131 and a second connection portion 132, wherein the first connection portion 131 is electrically connected to the column electrodes 151 at the first side 111, and the second connection portion 132 is electrically connected to at least a portion of the row electrodes 152 at the second side 112. The first side 111 is perpendicular to the second side 112.

In this embodiment, the substrate 110 further comprises a third side 113, the third side 113 is parallel to the second side 112, the flexible print circuit board 130 further comprises a third connection portion 133, and the third connection portion 133 is electrically connected to at least a portion of the row electrodes 152 at the third side 113. The single row electrode 152 can be electrically connected to the second connection portion 132 and the third connection portion 133 simultaneously, or electrically connects to one of the second connection portion 132 and the third connection portion 133.

In this embodiment, when the interface module 100 is a display module, the column electrodes 151 and the row electrodes 152 are respectively data lines and scan lines. When the interface module 100 is a touch panel module, the column electrodes 151 and the row electrodes 152 are both sensing electrodes, or, the column electrodes 151 or the row electrodes 152 are sensing electrodes.

Figure 2A:
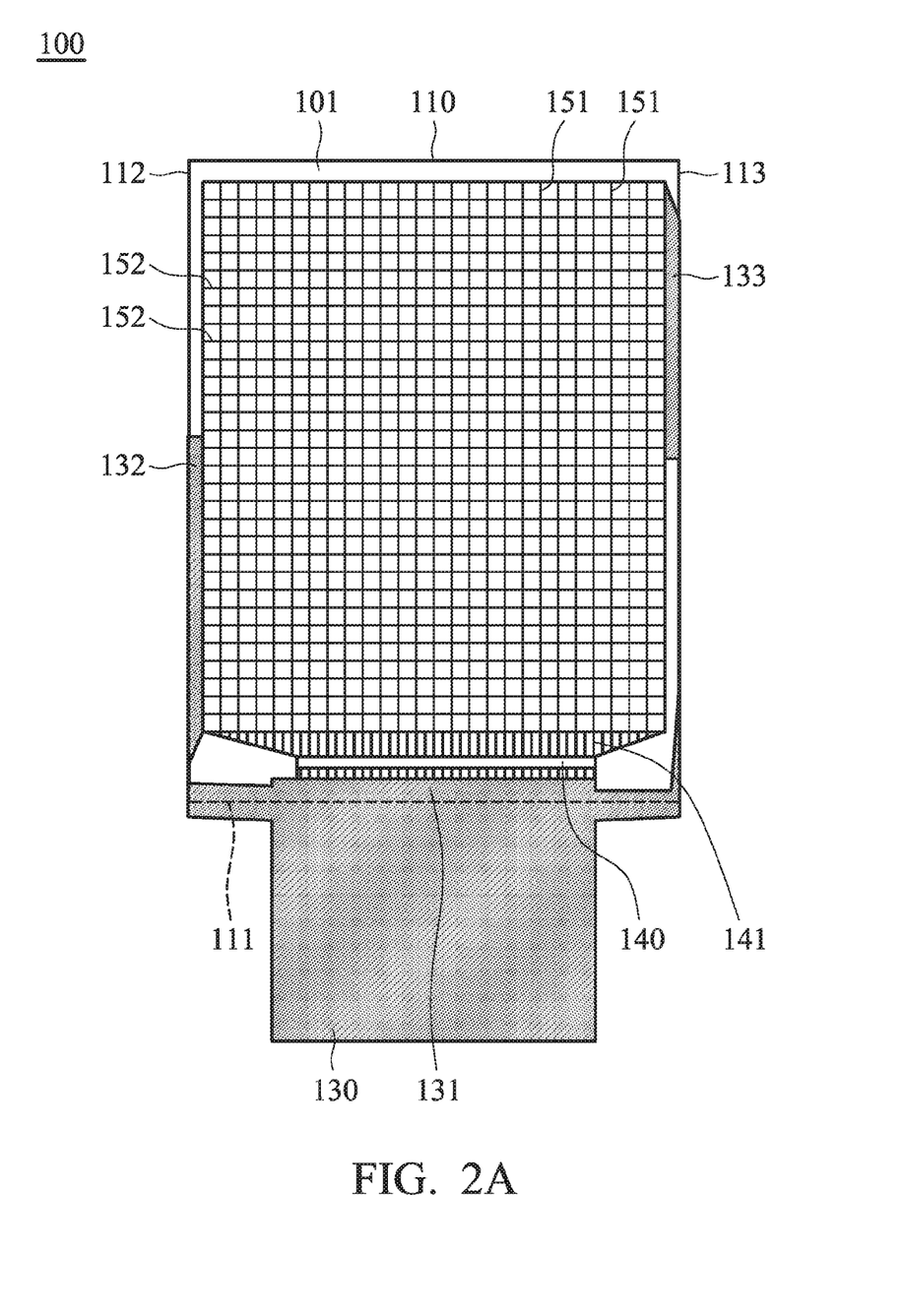
FIG. 2A is a top view showing the bent flexible print circuit board of the first embodiment of the invention.
Figure 2B:
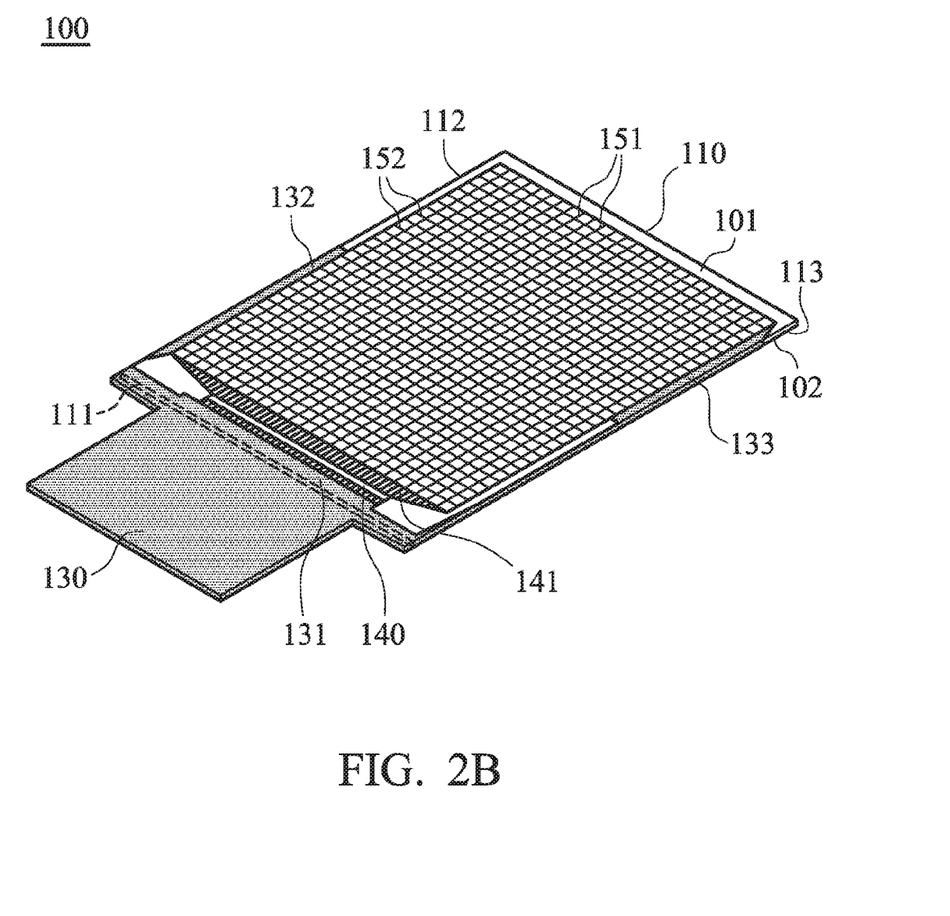
FIG. 2B is a perspective view showing the bent flexible print circuit board of the first embodiment of the invention.

In one embodiment, the flexible print circuit board 130 is integrally formed. With reference to FIGS. 2A and 2B, the interface module 100 comprises an interface side 101 and a back side 102, the interface side 101 is opposite to the back side 102, and at least a portion of the second connection portion 132 and the third connection portion 133 are bent to contact the back side 102.

Utilizing the interface module of the embodiments of the invention, the flexible print circuit board 130 is electrically connected to the row electrodes on the second and third sides of the substrate, and the flexible print circuit board 130 is bent and attached to the back side 102 of the interface module. The dimension of the interface module is therefore decreased.

Figure 2C:
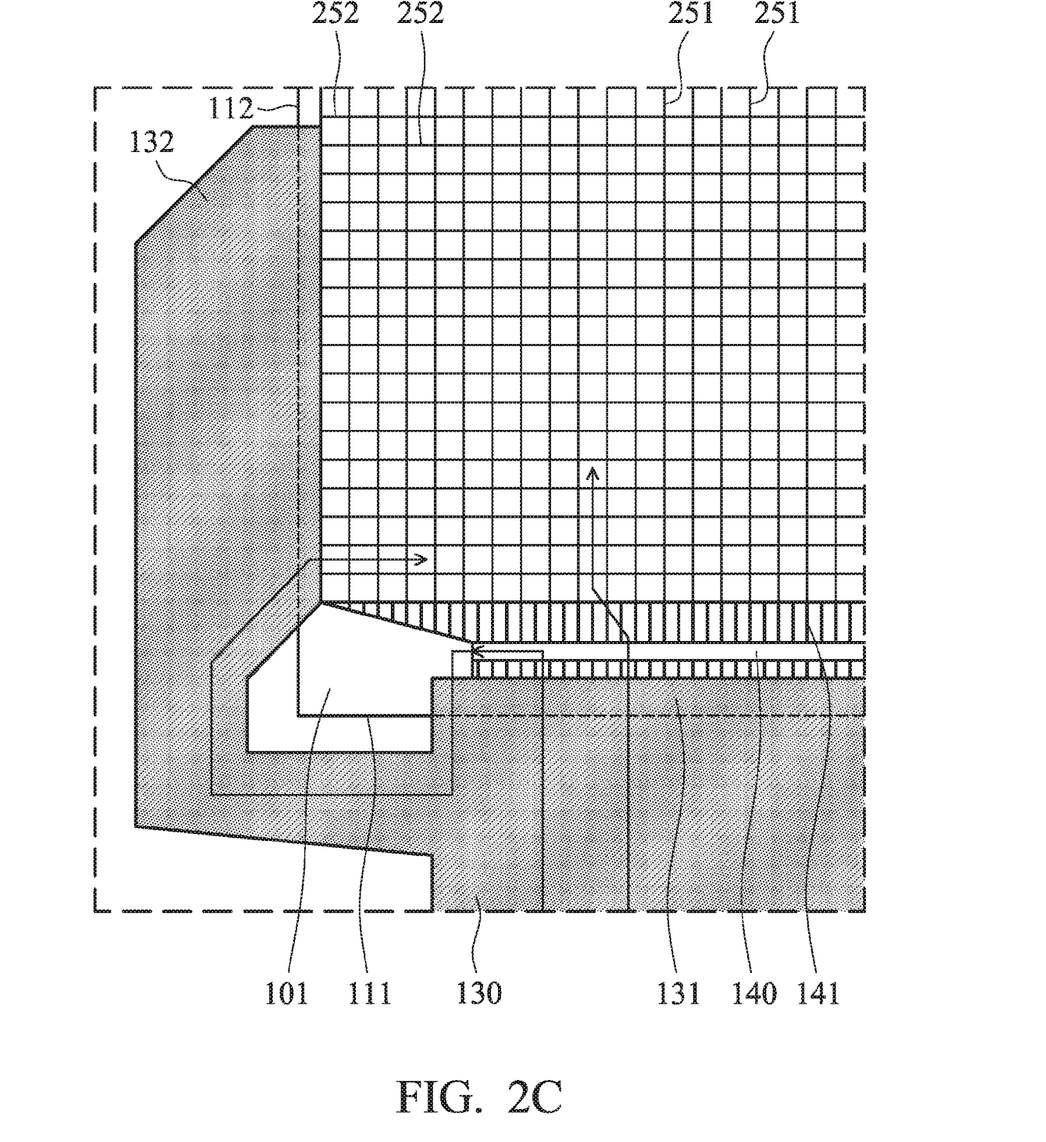
FIG. 2C shows signal transmission path of the first embodiment of the invention.

With reference to FIG. 1, in this embodiment, the interface module 100 further comprises an integrated circuit 140, wherein the integrated circuit 140 is disposed on the first side 111 of the substrate 110, and the column electrodes 151 are electrically connected to the integrated circuit 140 via trace 141. The first connection portion 131 is electrically connected to the integrated circuit 140. With reference to FIG. 2C, a main board (not shown) provides a signal, and the signal is transmitted to the integrated circuit 140 via the flexible print circuit board 130. The integrated circuit 140 outputs a row signal and a column signal according to the signal from the main board, the column signal is transmitted through the trace 141 to one of the column electrodes 151, and the row signal is transmitted through the trace 141 to one of the row electrodes 152 via the second connection portion 132 (or, via the second connection portion 132 and the third connection portion 133) of the flexible print circuit board 130. In another embodiment, the integrated circuit 140 is disposed on the flexible print circuit board 130, and when the integrated circuit 140 outputs the column signal and the row signal, the column signal passes through the first connection portion 131 of the flexible print circuit board 130 and the trace 141 to one of the column electrodes, and the row signal passes through the second connection portion 132 (or, the second connection portion 132 and the third connection portion 133) to one of the row electrodes.

Figure 3A:
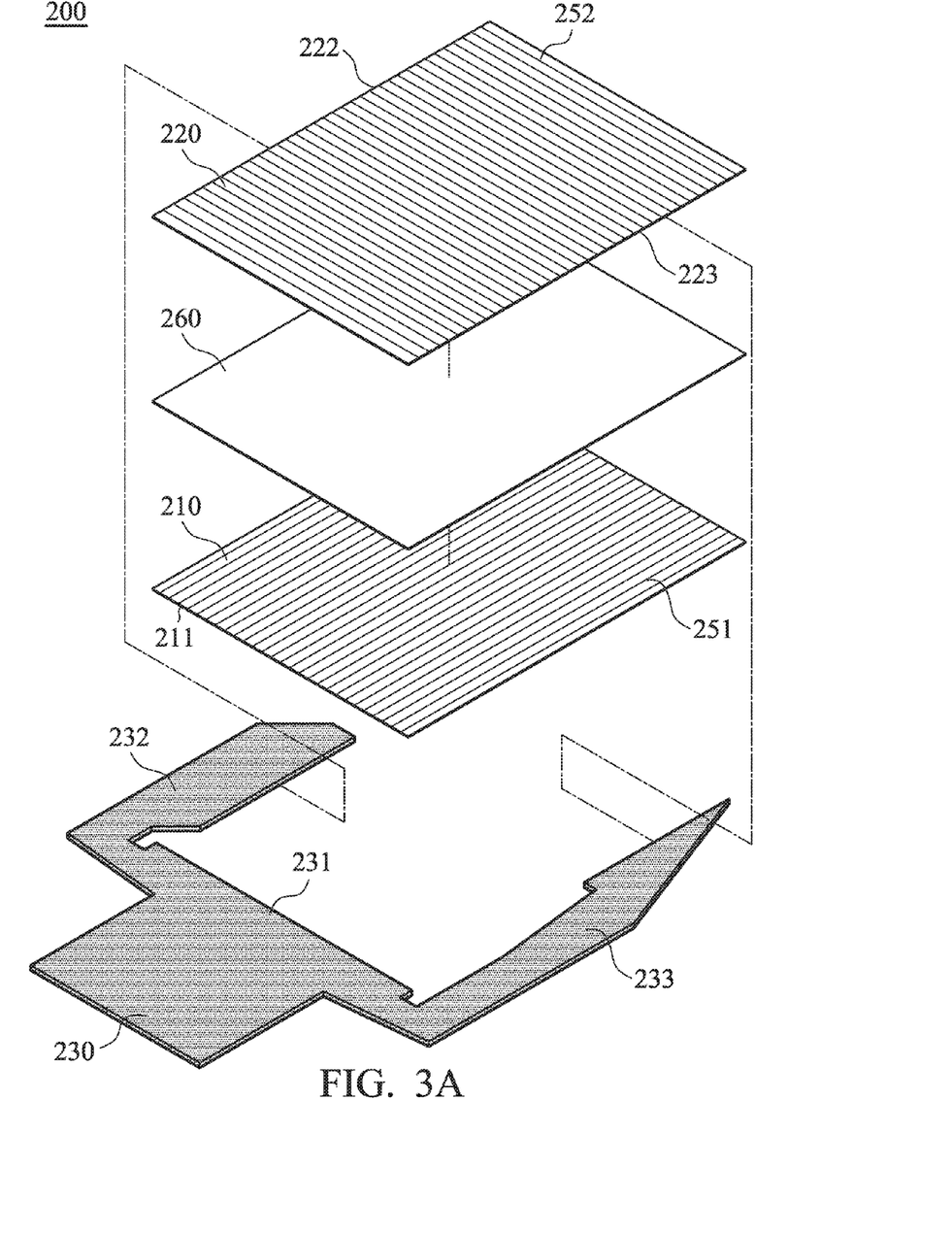
FIG. 3A is an exploded view of the interface of a second embodiment of the invention.
Figure 3B:
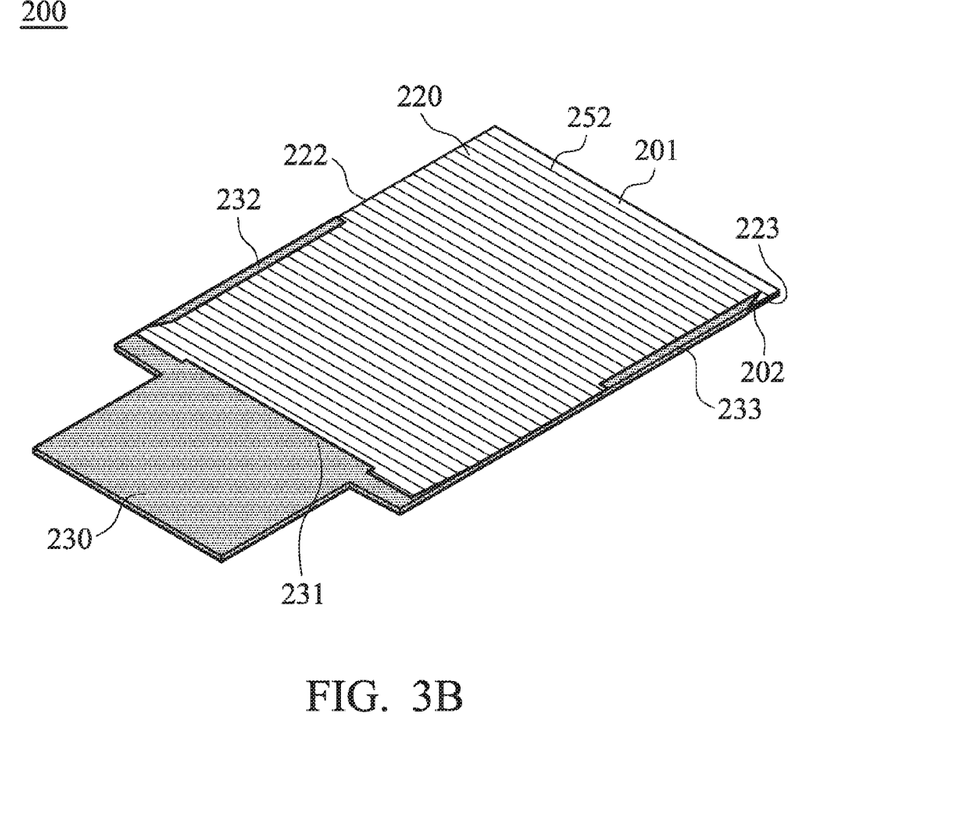
FIG. 3B is an assembled view of the interface of a second embodiment of the invention.

FIGS. 3A and 3B show interface module 200 of a second embodiment of the invention, comprising a first substrate 210, a second substrate 220 and a flexible print circuit board 230. The first substrate 210 comprises a first side 211 and a plurality of column electrodes 251, wherein the column electrodes 251 are formed on the first substrate 210 and arranged along the first side 211, and the column electrodes 251 extend to a first edge of the first side 211. The second substrate 220 comprises a second side 222 and a plurality of row electrodes 252, wherein the row electrodes 252 are formed on the second substrate 220 and arranged along the second side 222, the row electrodes 252 extend to a second edge of the second side 222, and the first side 211 is perpendicular to the second side 222. The dimension of the first substrate 210 is greater than the second substrate 220. When the first substrate 210 overlaps the second substrate 220, the column electrodes 251 adjacent to the first edge of the first side 211 are exposed. In a modified example, the positions of the first substrate 210 and the second substrate 220 can be exchanged, wherein the dimension of the first substrate 210 is smaller than the second substrate 220, and when the first substrate 210 overlaps the second substrate 220, the row electrodes 252 adjacent to the second edge of the second side 222 are exposed. The flexible print circuit board 230 comprises a first connection portion 231 and a second connection portion 232, wherein the first connection portion 231 is electrically connected to the column electrodes 251 at the first side 211, and the second connection portion 232 is electrically connected to at least a portion of the row electrodes 252 at the second side 222.

In a modified example, the interface module 200 comprises a first substrate 210, a second substrate 220 and a flexible print circuit board 230. The first substrate 210 comprises a first side 211 and a plurality of column electrodes 251, wherein the column electrodes 251 are formed on a lower surface of the first substrate 210 and arranged along the first side 211, and the column electrodes 251 extend to a first edge of the first side 211. The second substrate 220 comprises a second side 222 and a plurality of row electrodes 252, wherein the row electrodes 252 are formed on an upper surface of the second substrate 220 and arranged along the second side 222, the row electrodes 252 extend to a second edge of the second side 222, and the first side 211 is perpendicular to the second side 222. In a modified example, the positions of the first substrate 210 and the second substrate 220 can be exchanged, wherein the column electrodes 251 are formed on an upper surface of the first substrate 210, and the row electrodes 252 are formed on a lower surface of the second substrate 220. The flexible print circuit board 230 comprises a first connection portion 231 and a second connection portion 232, wherein the first connection portion 231 is electrically connected to the column electrodes 251 at the first side 211, and the second connection portion 232 is electrically connected to at least a portion of the row electrodes 252 at the second side 222.

In the two embodiments above, the second substrate 220 comprises a third side 223, the third side 223 is parallel to the second side 222, the row electrodes 252 extend to a third edge of the third side 223, the flexible print circuit board 230 further comprises a third connection portion 233, and the third connection portion 233 is electrically connected to at least a portion of the row electrodes 252 at the third side 223. The single row electrode 252 can be electrically connected to the second connection portion 232 and the third connection portion 233 simultaneously, or electrically connects to one of the second connection portion 232 and the third connection portion 233.

In these two embodiments, when the interface module 200 is a touch panel module, the column electrodes 251 and the row electrodes 252 are both sensing electrodes, or, the column electrodes 251 or the row electrodes 252 are sensing electrodes.

The interface module 200 can further comprise an optical film 260, wherein the optical film 260 is disposed between the first substrate 210 and the second substrate 220.

With reference to FIG. 3B, the flexible print circuit board 230 is integrally formed. Similar to the first embodiment of the invention, the interface module 200 comprises an interface side 201 and a back side 202, the interface side 201 is opposite to the back side 202, and at least a portion of the second connection portion 232 and the third connection portion 233 are bent to contact the back side 202.

Figure 4:
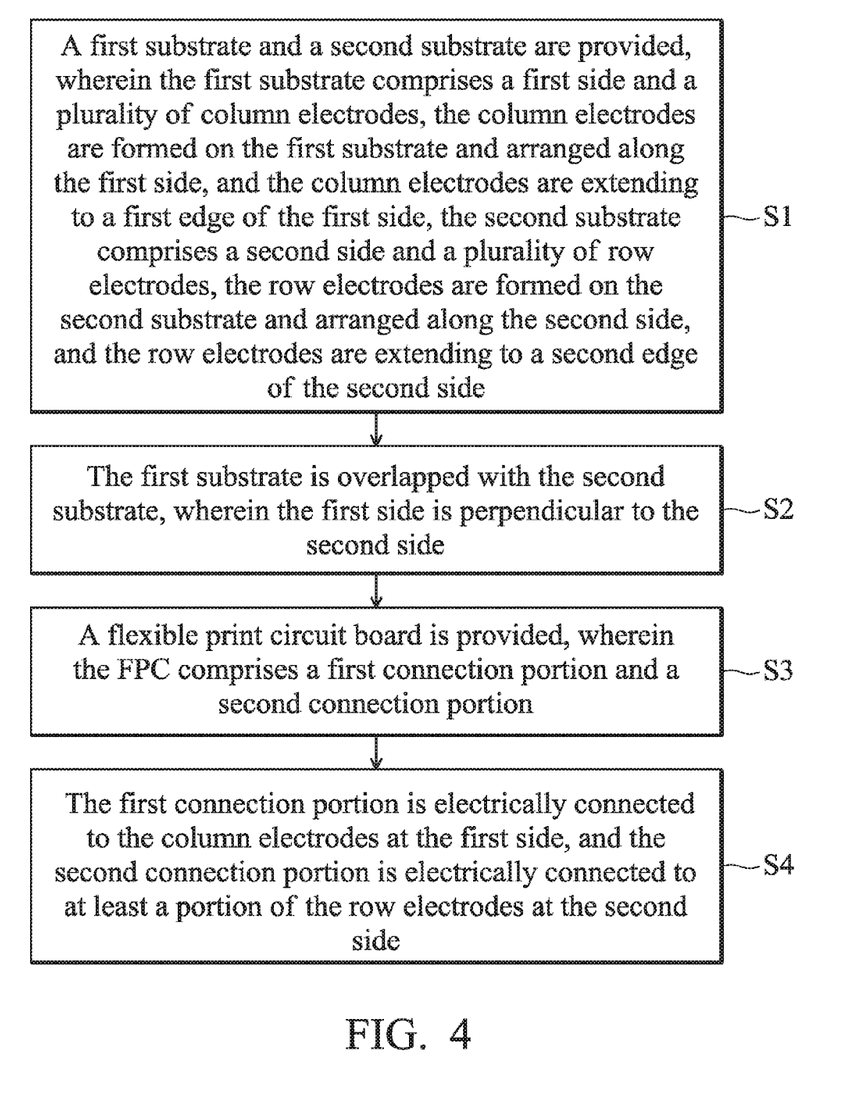
FIG. 4 shows a method for manufacturing an interface module of an embodiment of the invention.

FIG. 4 shows a method for manufacturing an interface module of an embodiment of the invention. First, a first substrate and a second substrate are provided, wherein the first substrate comprises a first side and a plurality of column electrodes, the column electrodes are formed on the first substrate and arranged along the first side, and the column electrodes are extended to a first edge of the first side, the second substrate comprises a second side and a plurality of row electrodes, the row electrodes are formed on the second substrate and arranged along the second side, and the row electrodes are extended to a second edge of the second side (S1). Then, the first substrate is overlapped with the second substrate, wherein the first side is perpendicular to the second side (S2). Next, a flexible print circuit board is provided, wherein the flexible print circuit board comprises a first connection portion and a second connection portion (S3). Finally, the first connection portion is electrically connected to the column electrodes at the first side, and the second connection portion is electrically connected to at least a portion of the row electrodes at the second side (S4).

In this embodiment, when the interface module is a display module, the column electrodes and the row electrodes are respectively data lines and scan lines. When the interface module is a touch panel module, the column electrodes and the row electrodes are both sensing electrodes, or, the column electrodes or the row electrodes are sensing electrodes.

Figure 5:
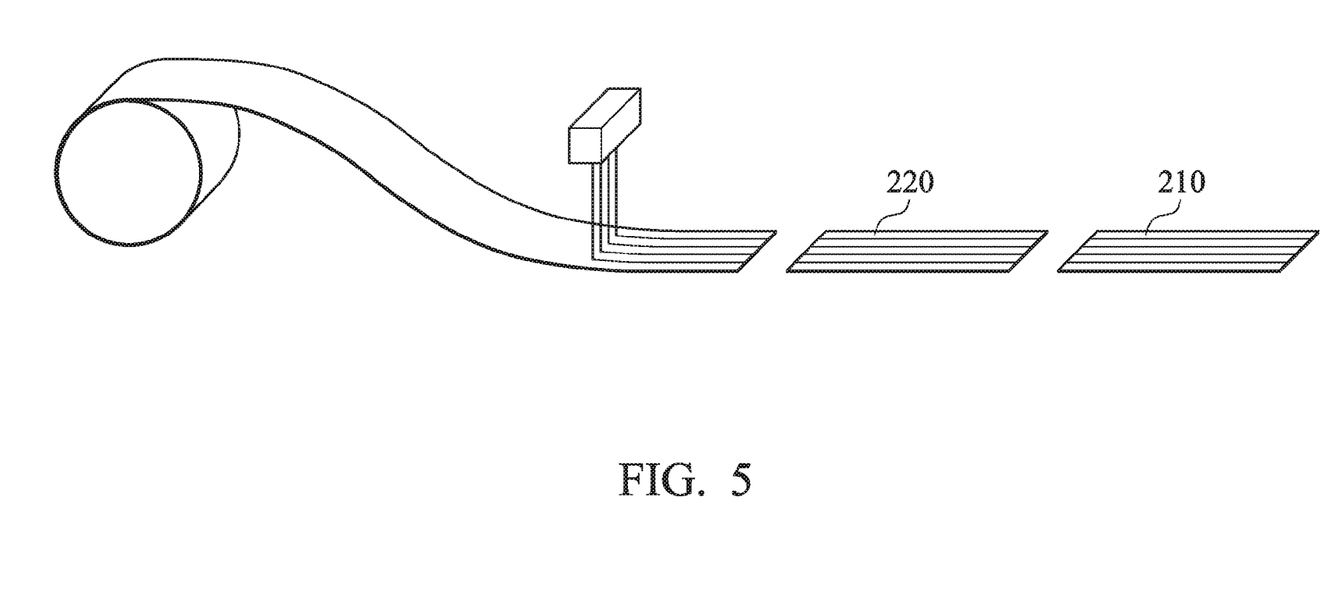
FIG. 5 shows the first substrate and the second substrate formed by a roll to roll process.

The first substrate and the second substrate are formed by a roll to roll process. With reference to FIG. 5, in the embodiments of the invention, parallel electrodes are formed on a continuous substrate material. Then, the substrate material is cut, and the first and second substrates are therefore obtained. The second substrate is rotated by 90°, and is overlapped with the first substrate. After assembled with other elements, the interface module of the embodiment is obtained. In a modified example, the first substrate and the second substrate can be respectively cut from tow different substrate material rolls with the same or different material components. Utilizing the method for manufacturing the interface module of the embodiment of the invention, the substrate can be mass produced, and manufacturing cost is therefore decreased.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch interface module, comprising:
    a substrate, comprising a first side, a second side, wherein the first side is substantially perpendicular to the second side;
    a plurality of touch column electrodes disposed on the substrate and arranged along the first side;
    a plurality of touch row electrodes disposed on the substrate and arranged along the second side; and
    a flexible print circuit board, comprising a first connection portion, a second connection portion and a third connection portion,
    wherein the flexible print circuit board is integrally formed, the first connection portion, the second connection portion and the third connection portion are separated from and without overlapping each other, and the first connection portion is electrically connected to a portion of the touch column electrodes,
    wherein the plurality of touch row electrodes comprise a first group and a second group, the first group comprises at least two continuous touch row electrodes, the second connection portion is directly connected to the first group of the touch row electrodes without passing through a first integrated circuit, the second group comprises at least two another continuous touch row electrodes, and the third connection portion is directly connected to the second group of the touch row electrodes without passing through a second integrated circuit.

2. The touch interface module as claimed in claim 1, wherein the at least two another continuous touch row electrodes of the second group is different from the at least two continuous touch row electrodes of the first group.

3. The touch interface module as claimed in claim 1, wherein the second connection portion is directly connected to the first group of the touch row electrodes,
    and the third connection portion is directly connected to the second group of the touch row electrodes.

4. The touch interface module as claimed in claim 1, wherein the touch column electrodes or the touch row electrodes are sensing electrodes.

5. The touch interface module as claimed in claim 1, further comprising a third integrated circuit, wherein the third integrated circuit is disposed on the first side of the substrate, the touch column electrodes are electrically connected to the third integrated circuit, the first connection portion is electrically connected to the third integrated circuit, the third integrated circuit outputs a row signal, and the row signal is transmitted to one of the touch row electrodes via the second connection portion of the flexible print circuit board.

6. The touch interface module as claimed in claim 1, wherein the substrate comprises a third side, the third side is parallel to the second side, and the third connection portion is electrically connected to the second group of the touch row electrodes at the third side.

7. The touch interface module as claimed in claim 1, wherein the touch interface module comprises an interface side and a back side, the interface side is opposite to the back side, and at least a portion of the second connection portion is bent to contact the back side.

8. A touch panel, comprising:
    an interface module, comprising:
    a substrate, comprising a first side, a second side, wherein the first side is substantially perpendicular to the second side;
    a plurality of touch column electrodes disposed on the substrate and arranged along the first side;
    a plurality of touch row electrodes disposed on the substrate and arranged along the second side; and
    a flexible print circuit board, comprising a first connection portion, a second connection portion and a third connection portion,
    wherein the flexible print circuit board is integrally formed, the first connection portion, the second connection portion and the third connection portion are separated from and without overlapping each other, and the first connection portion is electrically connected to a portion of the touch column electrodes, wherein the plurality of touch row electrodes comprise a first group and a second group, the first group comprises at least two continuous touch row electrodes, the second connection portion is directly connected to the first group of the touch row electrodes without passing through an integrated circuit, the second group comprises at least two another continuous touch row electrodes, and the third connection portion is directly connected to the second group of the touch row electrodes without passing through an another integrated circuit.

9. The touch panel as claimed in claim 8, wherein the at least two another continuous touch row electrodes of the second group is different from the at least two continuous touch row electrodes of the first group.

10. The touch panel as claimed in claim 8, wherein the touch column electrodes or the touch row electrodes are sensing electrodes.

11. The touch panel as claimed in claim 8, wherein the substrate comprises a third side, the third side is parallel to the second side, and the third connection portion is electrically connected to the second group of the touch row electrodes at the third side.

12. The touch panel as claimed in claim 8, wherein the interface module comprises an interface side and a back side, the interface side is opposite to the back side, and at least a portion of the second connection portion is bent to contact the back side.

* * * * *